(12) United States Patent
Takizawa et al.

(10) Patent No.: US 12,369,258 B2
(45) Date of Patent: Jul. 22, 2025

(54) ELECTRONIC CIRCUIT MODULE

(71) Applicant: TDK CORPORATION, Tokyo (JP)

(72) Inventors: Shuichi Takizawa, Tokyo (JP); Atsushi Yoshino, Tokyo (JP); Yuki Okino, Tokyo (JP); Hiromu Harada, Tokyo (JP)

(73) Assignee: TDK Corporation, Tokyo (JP)

( * ) Notice: Subject to any disclaimer, the term of this patent is extended or adjusted under 35 U.S.C. 154(b) by 111 days.

(21) Appl. No.: 18/340,379

(22) Filed: Jun. 23, 2023

(65) Prior Publication Data

US 2023/0337371 A1  Oct. 19, 2023

Related U.S. Application Data

(63) Continuation-in-part of application No. 17/671,119, filed on Feb. 14, 2022, now Pat. No. 11,979,988.

(30) Foreign Application Priority Data

Dec. 15, 2020 (JP) ................. 2020-207226

(51) Int. Cl.
*H05K 1/14* (2006.01)
*H05K 1/18* (2006.01)
*H05K 3/28* (2006.01)

(52) U.S. Cl.
CPC ............... *H05K 3/28* (2013.01); *H05K 1/181* (2013.01)

(58) Field of Classification Search
CPC .... H05K 1/14; H05K 1/141–147; H05K 1/18; H05K 1/181–187; H01L 23/28; H01L 23/48; H01L 23/66; H01L 23/498; H01L 23/552; H01L 21/561–563

USPC ............... 361/764, 770–787, 790–795; 257/660–690, 787–790; 174/520
See application file for complete search history.

(56) References Cited

U.S. PATENT DOCUMENTS

| | | | | |
|---|---|---|---|---|
| 7,446,262 B2 * | 11/2008 | Ogawa | ............... | H01L 23/13 |
| | | | | 174/255 |
| 8,067,308 B2 | 11/2011 | Suthiwongsunthorn et al. | | |
| 8,884,411 B2 * | 11/2014 | Kadoguchi | ....... | H01L 23/49575 |
| | | | | 257/625 |
| 9,030,003 B2 * | 5/2015 | Minamio | ............... | H01L 21/565 |
| | | | | 257/713 |
| 9,848,496 B2 * | 12/2017 | Nakao | ............... | H01L 24/97 |
| 2008/0315372 A1 | 12/2008 | Kuan et al. | | |
| 2010/0172116 A1 * | 7/2010 | Yorita | ............... | H01L 21/565 |
| | | | | 29/830 |
| 2015/0255361 A1 * | 9/2015 | Lee | ............... | H01L 24/13 |
| | | | | 438/118 |
| 2016/0027764 A1 * | 1/2016 | Kim | ............... | H01L 25/105 |
| | | | | 257/686 |
| 2020/0066613 A1 | 2/2020 | Lee et al. | | |

FOREIGN PATENT DOCUMENTS

JP  2020-035993 A  3/2020

* cited by examiner

*Primary Examiner* — Tuan T Dinh
(74) *Attorney, Agent, or Firm* — Rimon P.C.

(57) ABSTRACT

Disclosed herein is an electronic circuit module that includes a circuit board, an electronic component mounted on an upper surface of the circuit board, and a mold member that covers the upper and side surfaces of the circuit board. The lower area of the side surface of the circuit board is exposed so as not to be covered with the mold member.

17 Claims, 13 Drawing Sheets

ELECTRONIC CIRCUIT MODULE

CROSS REFERENCE TO RELATED APPLICATIONS

This application is a Continuation-in-part of U.S. patent application Ser. No. 17/671,119, filed on Feb. 14, 2022, which claims the benefit of Japanese Application No. 2020-207226, filed on Dec. 15, 2020, the entire contents of each are hereby incorporated by reference.

FIELD OF THE INVENTION

The present invention relates to an electronic circuit module and a manufacturing method therefore and, more particularly, to an electronic circuit module capable of multiplexed implementation and a manufacturing method therefor.

DESCRIPTION OF RELATED ART

JP 2020-035993A discloses an electronic circuit module in which a first circuit board is mounted on a second circuit board, and the second circuit board is mounted on a third circuit board. In such multiplexed implementation, solder reflow is performed when the first circuit board is implemented on the second circuit board, and additional solder reflow is performed when the second circuit board is implemented on the third circuit board, so that the first circuit board is subjected to the solder reflow a plurality of times.

In a configuration in which an underfill material is filled between the first and second circuit boards, when an excess part of the underfill material reaches the upper surface of a mold member covering the first circuit board, delaminating is likely to occur during solder reflow at the boundary between the mold member covering the first circuit board and a mold member covering the second circuit board. Even when the underfill member is not used, delaminating is likely to occur during solder reflow at the boundary between the lower surface (mounting surface) of the first circuit board and the mold member covering the second circuit board.

Propagation of such delaminating may cause a connection defect. This becomes remarkable when the reflow is performed a plurality of times.

SUMMARY

An object of the present invention is therefore to provide an electronic circuit module in which a connection defect caused by delaminating due to a thermal load during solder reflow is less likely to occur and a manufacturing method therefor.

An electronic circuit module according to the present invention includes: a first circuit board having a plurality of terminal electrodes on its lower surface; an electronic component mounted on the upper surface of the first circuit board positioned on the side opposite to the lower surface; and a first mold member that covers the upper surface of the first circuit board and a side surface thereof connecting the upper and lower surfaces so as to embed therein the electronic component. A lower area of the side surface of the first circuit board that is positioned on the side close to the lower surface is not covered with the first mold member but is exposed.

According to the present invention, a space formed between the end surface of the first mold member and the lower area of the side surface of the first circuit board serves as a housing part for an underfill material, so that even when the amount of the underfill material is excessive, delaminating, which may occur during solder reflow, is less likely to propagate. Even when the underfill material is not used, delaminating is likely to occur at the boundary between the inner surface of the first mold member and the side surface of the first circuit board. Thus, making delaminating occur at this portion allows stress relief. This can prevent a connection defect caused by delaminating due to a thermal load.

In the present invention, a part of the first mold member that covers the side surface of the first circuit board may have an inner surface contacting the side surface of the first circuit board and an outer surface positioned on the side opposite to the inner surface, and the outer surface may protrude toward the lower surface of the first circuit board from the inner surface. This further facilitates housing of an excess part of the underfill material. In this case, the end surface of the first mold member that connects a lower end portion of the outer surface and a lower end portion of the inner surface may have a tapered shape protruding toward the lower surface of the first circuit board as it separates from the side surface of the first circuit board. This still further facilitates the accommodation of an excess part of the underfill material.

The electronic circuit module according to the present invention may further include: a second circuit board that mounts the first circuit board on the upper surface thereof; and a second mold member that covers the upper surface of the second circuit board so as to embed therein the first circuit board. This can prevent delaminating at the boundary between the first and second mold members and a connection defect of another electronic component mounted on the second circuit board. In this case, the underfill member may further be supplied between the lower surface of the first circuit board and the upper surface of the second circuit board so as to cover a part of the side surface of the first circuit board that is exposed from the first mold member. Alternatively, the second mold member may cover the part of the side surface of the first circuit board that is exposed from the first mold member.

The electronic circuit module according to the present invention may further include a third circuit board that mounts thereon the second circuit board. This can prevent a defect in the first and second circuit boards which may occur in solder reflow performed when the second circuit board is mounted on the third circuit board.

An electronic circuit module manufacturing method according to the present invention includes: a first step of preparing a first circuit board having a plurality of terminal electrodes on its lower surface and an electronic component on the upper surface of the first circuit board positioned on the side opposite to the lower surface and sticking the lower surface of the first circuit board to a support member; a second step of covering, with a space forming material, the side surface of the first circuit board that connects the upper and lower surfaces not entirely, but selectively at a lower area of the side surface positioned on the side close to the lower surface; a third step of forming a first mold member that covers the upper and side surfaces of the first circuit board so as to embed therein the electronic component; and a fourth step of removing the support member and space forming material and cutting the first mold member for individualization.

According to the present invention, the lower area of the side surface of the first circuit board can be exposed without being covered with the first mold member.

The electronic circuit module manufacturing method according to the present invention may further include: a fifth step of preparing a second circuit board and mounting the first circuit board on the upper surface of the second circuit board; and a sixth step of forming a second mold member that covers the upper surface of the second circuit board so as to embed therein the first circuit board. This can provide a secondary-mounted electronic circuit module. In this case, the method may further include, after the fifth step and before the sixth step, a step of filling an underfill material between the lower surface of the first circuit board and the upper surface of the second circuit board. This makes delaminating occurring during solder reflow less likely to propagate even when the amount of the underfill member is excessive.

The electronic circuit module manufacturing method according to the present invention may further include a seventh step of preparing a third circuit board and mounting the second circuit board on the third circuit board. This can provide a tertiary-mounted electronic circuit module.

As described above, according to the present invention, there can be provided an electronic circuit module in which a connection defect caused by delaminating due to a thermal load during solder reflow is less likely to occur and a manufacturing method therefor.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
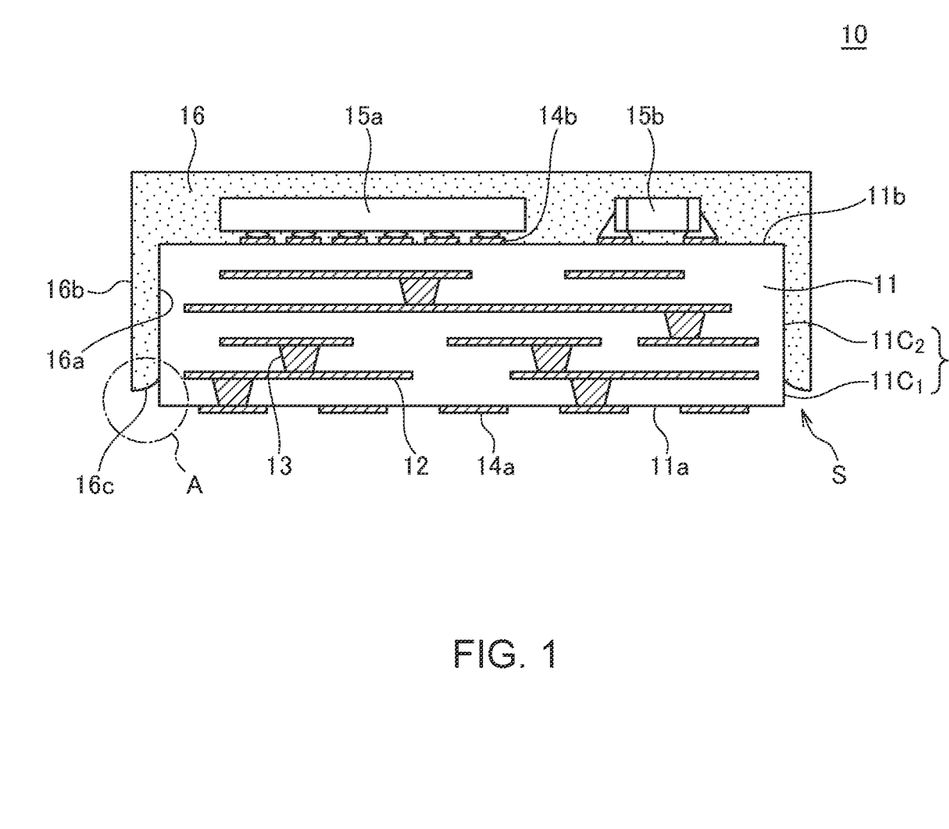
FIG. 1 is a schematic cross-sectional view for explaining the structure of an electronic circuit module according to a first embodiment of the present invention.

FIG. 1 is a schematic cross-sectional view for explaining the structure of an electronic circuit module according to a first embodiment of the present invention.

As illustrated in FIG. 1, the electronic circuit module 10 according to the first embodiment has a circuit board 11 having a lower surface 11a, an upper surface 11b, and a side surface 11c, electronic components 15a and 15b mounted on the upper surface 11b of the circuit board 11, and a mold member 16 that covers the upper surface 11b and side surface 11c of the circuit board 11 so as to embed therein the electronic components 15a and 15b. The circuit board 11 is a multilayer substrate including a plurality of wiring layers 12 and a plurality of via conductors 13 each connecting the wiring layers 12 and has a plurality of terminal electrodes 14a and 14b on the lower and upper surfaces 11a and 11b, respectively. The circuit board 11 is not particularly limited in structure and material and may be a wiring body of metal, ceramic, polymer, or a composite material thereof. The lower and upper surfaces 11a and 11b of the circuit board 11 are main surfaces positioned on the sides opposite to each other. The electronic components 15a and 15b mounted on the upper surface 11b of the circuit board 11 are connected respectively to their corresponding terminal electrodes 14b through a solder. The electrode component is not particularly limited in type. For example, the electrode component 15a is a filter circuit or a semiconductor IC, and the electrode component 15b is a chip component such as a capacitor or an inductor.

The mold member 16 covers not only the upper surface 11b of the circuit board 11 but also the side surface 11c. The side surface 11c of the circuit board 11 connects the end portion of the lower surface 11a and end portion of the upper surface 11b and is typically perpendicular to the lower and upper surfaces 11a and 11b. The side surface 11c does not need to be completely perpendicular to the lower surface 11a and the upper surface 11b, and may have an inclination of about 80° to 100° with respect to at least in part of the lower surface 11a and the upper surface 11b. The lower surface 11a, the upper surface 11b, and the side surface 11c of the circuit board 11 may be flat or partially or wholly uneven. For example, the lower surface 11a or the upper surface 11b of the circuit board 11 may be wholly convex or wholly concave. The mold member 16 does not cover the entire side surface 11c of the circuit board 11 but selectively covers an upper area $11c_2$ positioned on the side close to the upper surface 11b without covering a lower area $11c_1$ positioned on the side close to the lower surface 11a. Accordingly, the lower area $11c_1$ is not covered with the mold member 16 but is exposed. However, when the lower area $11c_1$ not covered with the mold member 16 is excessively wide, reliability may degrade, so that the lower area $11c_1$ is preferably smaller than the upper area $11c_2$ and more preferably smaller than or equal to half of the upper area $11c_2$.

Figures 2A, 2B, 2C:
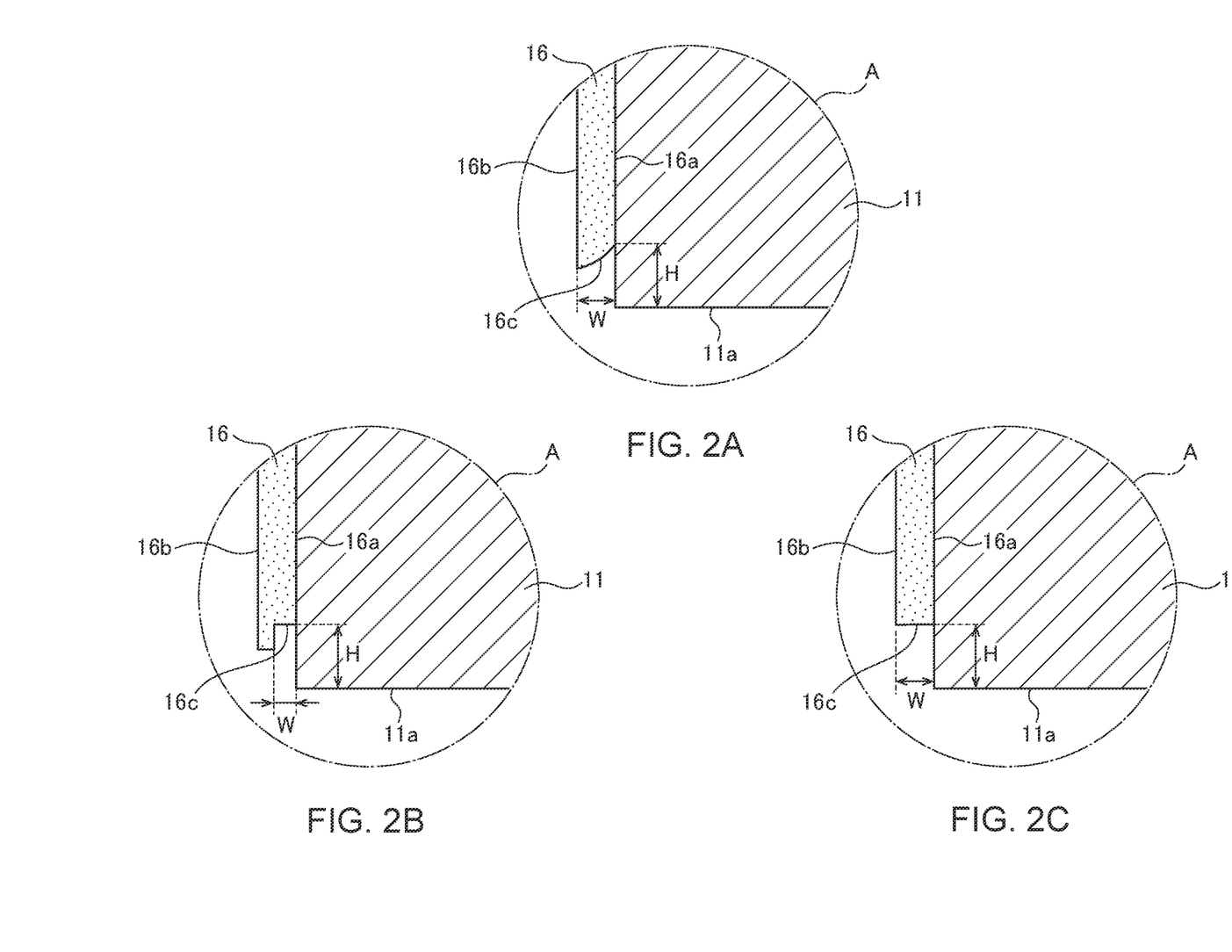
FIG. 2A is an enlarged view of a first example of the area A shown in FIG. 1.
FIG. 2B is an enlarged view of a second example of the area A shown in FIG. 1.
FIG. 2C is an enlarged view of a third example of the area A shown in FIG. 1.

A part of the mold member 16 that covers the side surface 11c of the circuit board 11 has an inner surface 16a contacting the side surface 11c of the circuit board 11 and an outer surface 16b positioned on the side opposite to the inner surface 16a. The inner surface 16a and the outer surface 16b are almost parallel to each other. The outer surface 16b protrudes from the inner surface 16a toward the lower surface 11a of the circuit board 11. In the present embodiment, an end surface 16c connecting the lower end portion of the outer surface 16b and the lower end portion of the inner surface 16a has a tapered shape protruding toward the lower surface 11a of the circuit board 11 as it separates from the side surface 11c of the circuit board 11. Thus, a space S is formed by the end surface 16c of the mold member 16 and the lower area $11c_1$ of the side surface $11c$ of the circuit board 11. As illustrated in FIG. 2A which is an enlarged view of the area A illustrated in FIG. 1, the space S preferably has a height H of about 15 μm to about 300 μm and a width W of about 15 μm to about 250 μm. The space S functions as a housing part for an underfill material to be described later.

However, the end surface $16c$ of the mold member 16 need not necessarily have a tapered shape and may have a step-like shape as illustrated in FIG. 2B or a flat shape as illustrated in FIG. 2C. When the end surface $16c$ of the mold member 16 has a step-like shape as illustrated in FIG. 2B, the space S has a more closed shape, with the result that it functions more effectively as a housing part, whereas the width W of the space S decreases to reduce the volume of the space S. On the other hand, when the end surface $16c$ of the mold member 16 has a flat shape as illustrated in FIG. 2C, the volume of the space S increases, whereas the space S has a more opened shape, with the result that the function as a housing part deteriorates. Considering the above, the end surface $16c$ of the mold member 16 most preferably has a tapered shape as illustrated in FIG. 2A.

Figure 2D:
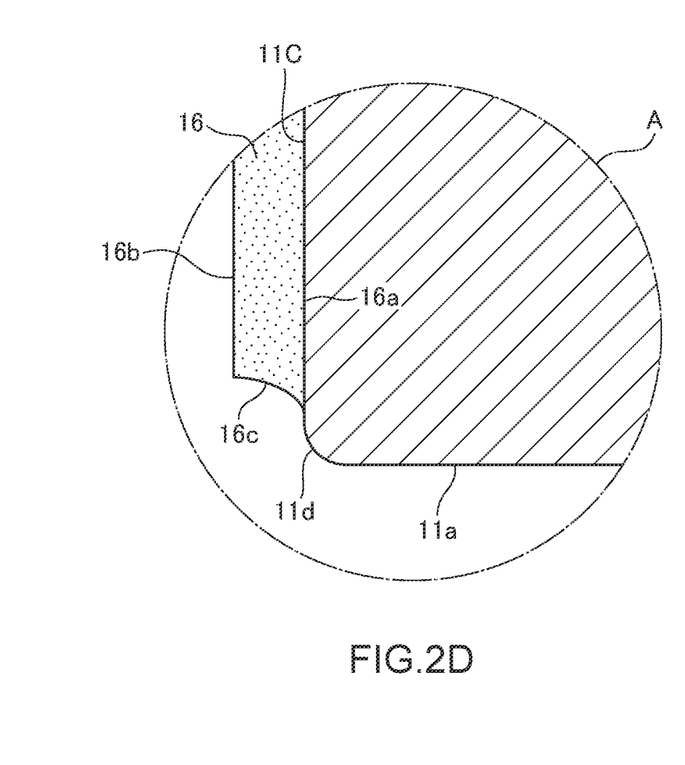
FIG. 2D is an enlarged view of a fourth example of the area A shown in FIG. 1.
Figure 2E:
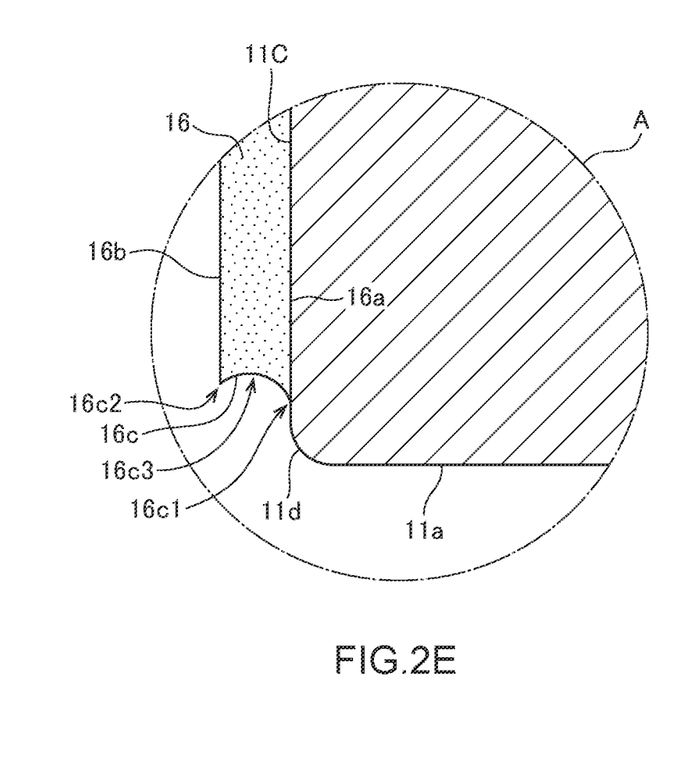
FIG. 2E is an enlarged view of a fifth example of the area A shown in FIG. 1.

As shown in FIGS. 2D and 2E, the end surface $16c$ of the mold member 16 may have a curved shape forming a concave surface. In the example shown in FIG. 2D, the end surface $16c$ of the mold member 16 has a shape that becomes more horizontal as it separates from the side surface $11c$ of the circuit board 11. That is, the end surface $16c$ of the mold member 16 protrudes toward the lower surface $11a$ of the circuit board 11 as the side surface $11c$ of the circuit board 11 is approached. Further, as shown in FIG. 2D, the corner $11d$ located at the boundary between the lower surface $11a$ and the side surface $11c$ of the circuit board 11 may have a chamfered shape.

In the example shown in FIG. 2E, the end surface $16c$ of the mold member 16 has a lower end portion $16c1$ terminating at the inner surface $16a$, a lower end portion $16c2$ terminating at the outer surface $16b$, and a bottom portion $16c3$ located between the lower end portions $16c1$ and $16c2$. The height position of the lower end portion $16c1$ may be lower than the height position of the lower end portion $16c2$. In the section between the lower end portion $16c1$ and the bottom portion $16c5$, the end surface $16c$ of the mold member 16 has a shape that becomes more horizontal as it separates from the side surface $11c$ of the circuit board 11. In the section between the lower end portion $16c2$ and the bottom portion $16c5$, the end surface $16c$ of the mold member 16 has a shape that becomes more horizontal as it approaches the side surface $11c$ of the circuit board 11. That is, in the section between the lower end portion $16c1$ and the bottom portion $16c5$, the end surface $16c$ of the molding member 16 protrudes toward the lower surface $11a$ of the circuit board 11 as it approaches the side surface $11c$ of the circuit board 11, and in the section between the lower end portion $16c2$ and the bottom portion $16c5$, the end surface $16c$ of the mold member 16 protrudes toward the lower surface $11a$ of the circuit board 11 as it separates from the side surface $11c$ of the circuit board 11. The section between the lower end portion $16c1$ and the bottom portion $16c3$ may be greater than the section between the lower end portion $16c2$ and the bottom portion $16c5$. The bottom portion $16c3$ may be horizontal.

As shown in FIGS. 2D and 2E, the end surface $16c$ of the mold member 16 increases and the space S shown in FIG. 1 expands because the end face $16c$ of the mold member 16 is made concave.

Figure 3:
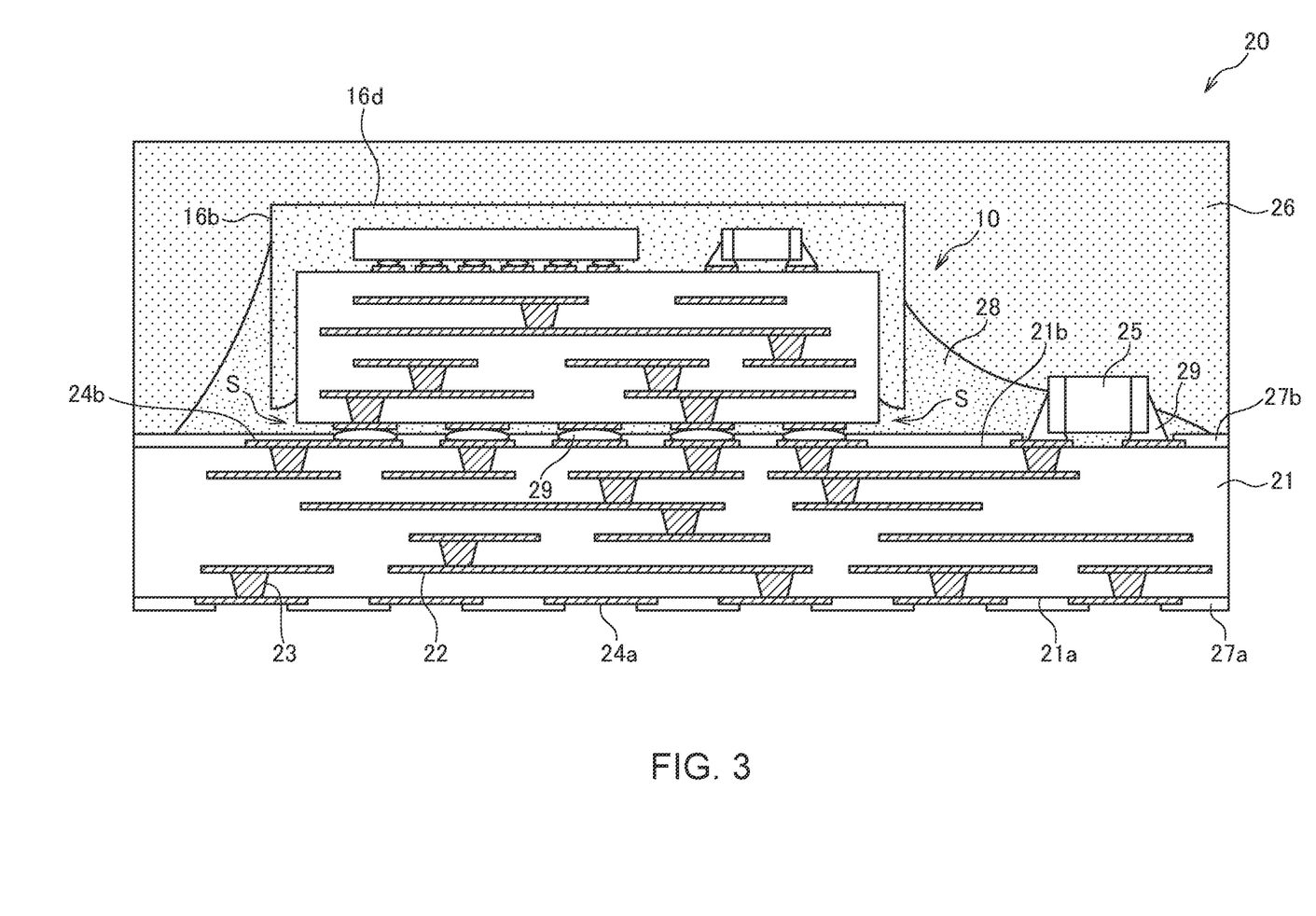
FIG. 3 is a schematic cross-sectional view for explaining the structure of an electronic circuit module according to a second embodiment of the present invention.

FIG. 3 is a schematic cross-sectional view for explaining the structure of an electronic circuit module according to a second embodiment of the present invention.

The electronic circuit module 20 according to the second embodiment has a configuration in which the electronic circuit module 10 illustrated in FIG. 1 is stacked on another circuit board 21. The circuit board 21 is a multilayer substrate including a plurality of wiring layers 22 and a plurality of via conductors 23 each connecting the wiring layers 22 and has a plurality of terminal electrodes $24a$ and $24b$ on the lower and upper surfaces $21a$ and $21b$, respectively. The lower surface $21a$ of the circuit board 21 is covered with a solder resist $27a$ except for portions at which the terminal electrodes $24a$ are exposed. The upper surface $21b$ of the circuit board 21 is covered with a solder resist $27b$ except for portions at which the terminal electrodes $24b$ are exposed. The electronic circuit module 10 illustrated in FIG. 1 is mounted on the upper surface $21b$ of the circuit board 21. The circuit board 21 and the circuit board 11 are connected through a solder 29. Another electronic component 25 may be mounted on the upper surface $21b$ of the circuit board 21.

A mold member 26 covers the upper surface $21b$ of the circuit board 21 so as to embed the electronic circuit module 10 and electronic component 25. In the example of FIG. 3, an underfill material 28 is filled between the lower surface $11a$ of the circuit board 11 and the upper surface $21b$ of the circuit board 21. In this case, the lower area $11c_1$ of the side surface $11c$ of the circuit board 11 is covered with the underfill material 28. An excess part of the underfill material 28 protrudes from the lower surface $11a$ of the circuit board 11 and reaches the outer surface $16b$ of the mold member 16. In the present embodiment, the electronic circuit module 10 has the space S, so that the excess part of the underfill material 28 is partly accommodated in the space S, thereby suppressing unnecessary spreading of the underfill material 28. In particular, although the underfill material 28 covers a part of the outer surface $16b$ of the mold member 16, it does not reach the upper surface $16d$ of the mold member 16 due to the presence of the space S.

Figure 4:
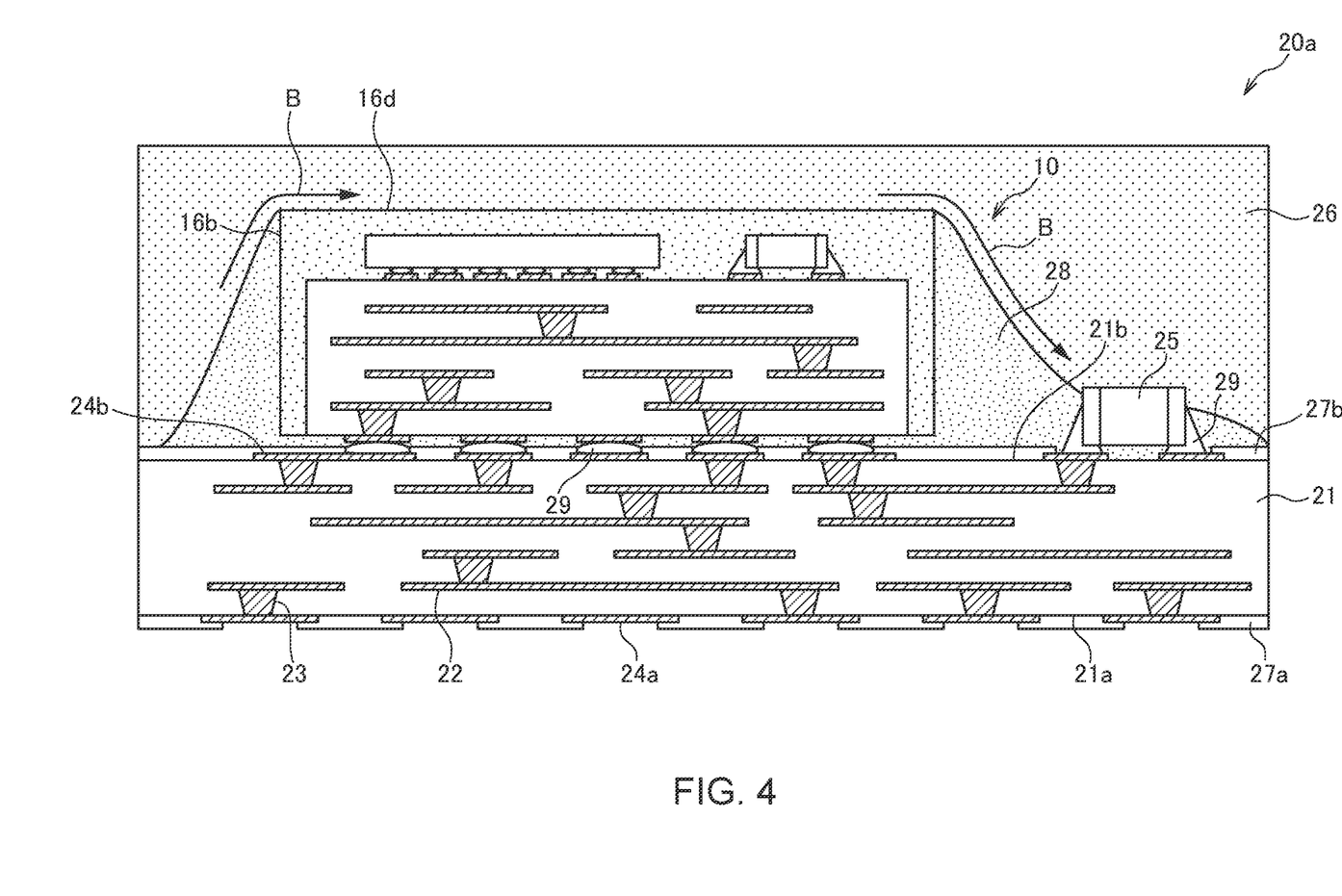
FIG. 4 is a schematic cross-sectional view for explaining the structure of an electronic circuit module 20a according to a comparative example.

FIG. 4 illustrates an electronic circuit module $20a$ according to a comparative example. As illustrated in FIG. 4, when an excess part of the underfill material 28 reaches the upper surface $16d$ of the mold member 16, delaminating (arrow B) at the boundary between the underfill material 28 and the mold member 26 propagates along the upper surface $16d$ of the mold member 16 and reaches the electronic component 25, which may break an electrical connection portion between the electronic component 25 and the circuit board 21. On the other hand, in the present embodiment, an excess part of the underfill material 28 is partly accommodated in the space S to make the delaminating denoted by the arrow B less likely to reach the upper surface $16d$ of the mold member 16. Thus, even if delaminating occurs at the boundary between the underfill material 28 and the mold member 26, propagation of the delaminating stops at the outer surface $16b$ of the mold member 16, which makes further delaminating less likely to occur. In particular, when the end surface $16c$ of the mold member 16 has the shape shown in FIGS. 2D and 2E, the space S is enlarged, so that a larger amount of the underfill material 28 can be accommodated.

Figure 5:
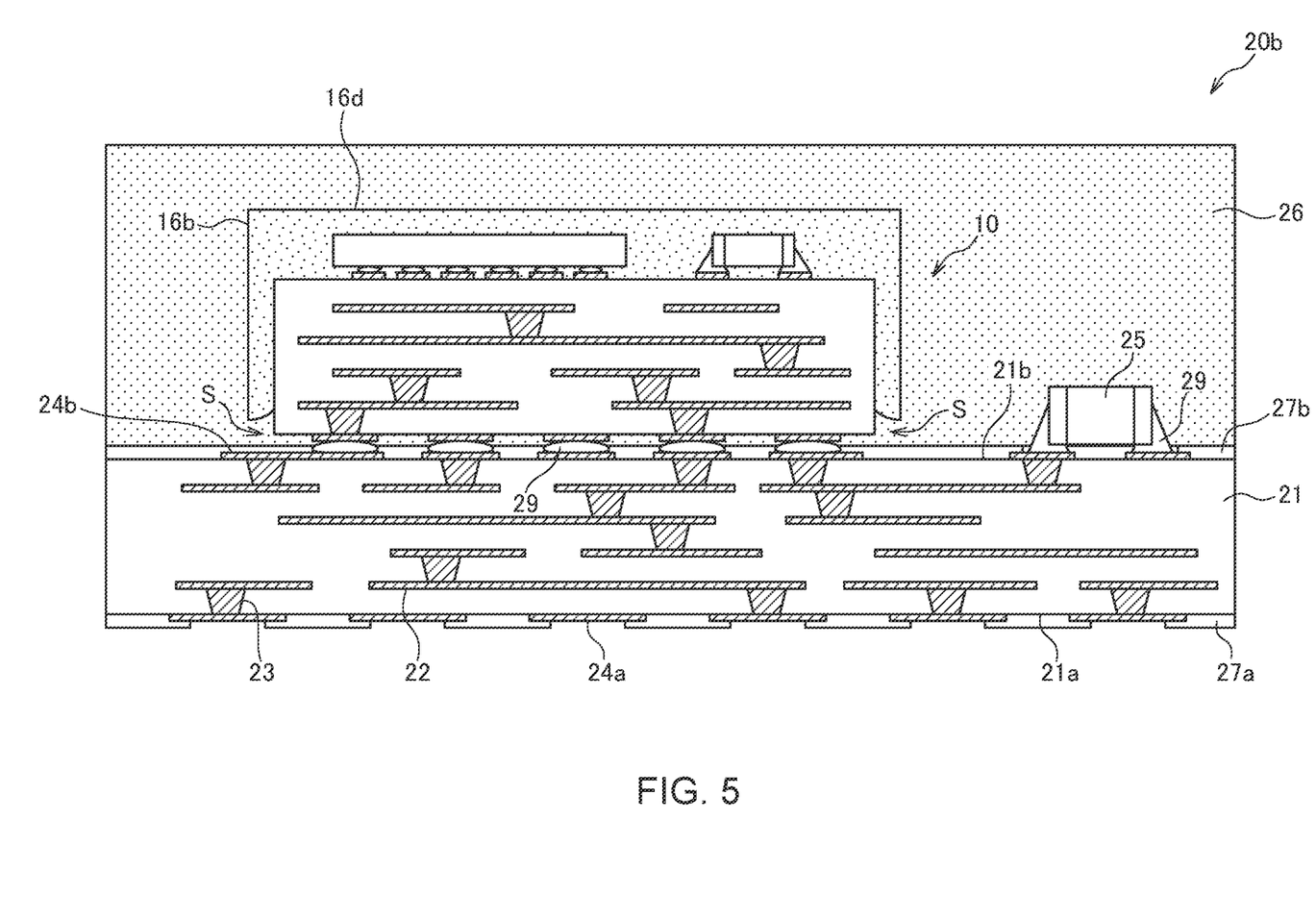
FIG. 5 is a schematic cross-sectional view for explaining the structure of an electronic circuit module 20b according to a third embodiment of the present invention.

FIG. 5 is a schematic cross-sectional view for explaining the structure of an electronic circuit module $20b$ according to a third embodiment of the present invention.

The electronic circuit module $20b$ according to the third embodiment differs from the electronic circuit module 20 illustrated in FIG. 3 in that it does not use the underfill material. In this case, the lower area $11c_1$ of the side surface $11c$ of the circuit board 11 is covered with the mold member 26. When the underfill material is not used, delaminating at the boundary between the mold member 26 and the underfill material does not occur; however, the absence of the underfill means that there are fewer portions for releasing the stress caused due to a thermal load. Accordingly, delaminating may be caused at the boundary between the lower surface $11a$ of the circuit board 11 and the mold member 26 by stress ascribable to thermal expansion of the solder 29, which may cause a connection defect between the electronic circuit module 10 or electronic components $15a$, $15b$ and the circuit board 21. However, in the present embodiment, the presence of the space S makes delaminating likely to occur at the boundary between the side surface $11c$ of the circuit board 11 and the mold member 16. Thus, making delaminating occur at this portion allows the stress to be released. Since neither element nor electrode exists on the side surface $11c$ of the circuit board 11, even if delaminating occurs at this portion, no malfunction is caused in the electronic circuit module $20b$. In particular, when the end surface $16c$ of the mold member 16 has the shape shown in FIGS. 2D and 2E, the space S is enlarged, so that the boundary between the side surface $11c$ of the circuit board 11 and the mold member 16 is more likely to delaminate.

Figure 6:
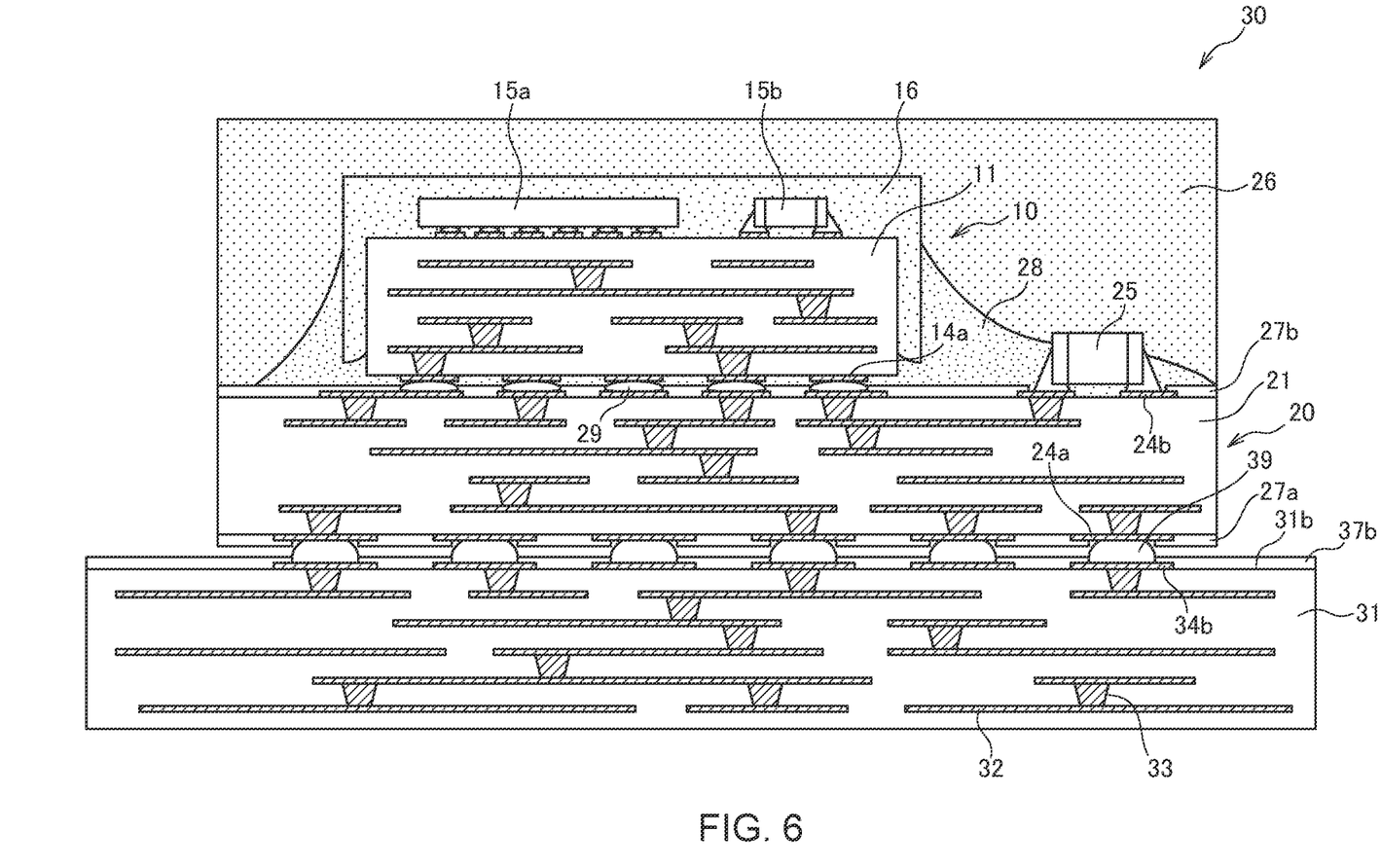
FIG. 6 is a schematic cross-sectional view for explaining the structure of an electronic circuit module 30 according to a fourth embodiment of the present invention.

FIG. 6 is a schematic cross-sectional view for explaining the structure of an electronic circuit module according to a fourth embodiment of the present invention.

The electronic circuit module 30 according to the fourth embodiment has a configuration in which the electronic circuit module 20 illustrated in FIG. 3 is stacked on still another circuit board 31. The circuit board 31 is a multilayer substrate including a plurality of wiring layers 32 and a plurality of via conductors 33 each connecting the wiring layers 32 and has a plurality of terminal electrodes $34b$ on an upper surface $31b$. The upper surface $31b$ of the circuit board 31 is covered with a solder resist $37b$ except for portions at which the terminal electrodes $34b$ are exposed. The electronic circuit module 20 illustrated in FIG. 3 is mounted on the upper surface $31b$ of the circuit board 31. The circuit board 31 and the circuit board 21 are connected through a solder 39. Another electronic circuit module and/or another electronic component (not illustrated) may be mounted on the upper surface $31b$ of the circuit board 31.

In a process of manufacturing the thus configured electronic circuit module 30, solder reflow is performed when the electronic circuit module 10 is mounted on the circuit board 21, and additional solder reflow is performed when the electronic circuit module 20 is mounted on the circuit board 31. That is, a thermal load is applied to the electronic circuit module 20 a plurality of times. However, in the present embodiment, unnecessary spreading of the underfill material 28 is suppressed as described above, which makes a connection defect caused by propagation of delaminating due to a thermal load less likely to occur.

The following describes a manufacturing method for the electronic circuit module 10 according to the first embodiment of the present invention.

Figure 7:
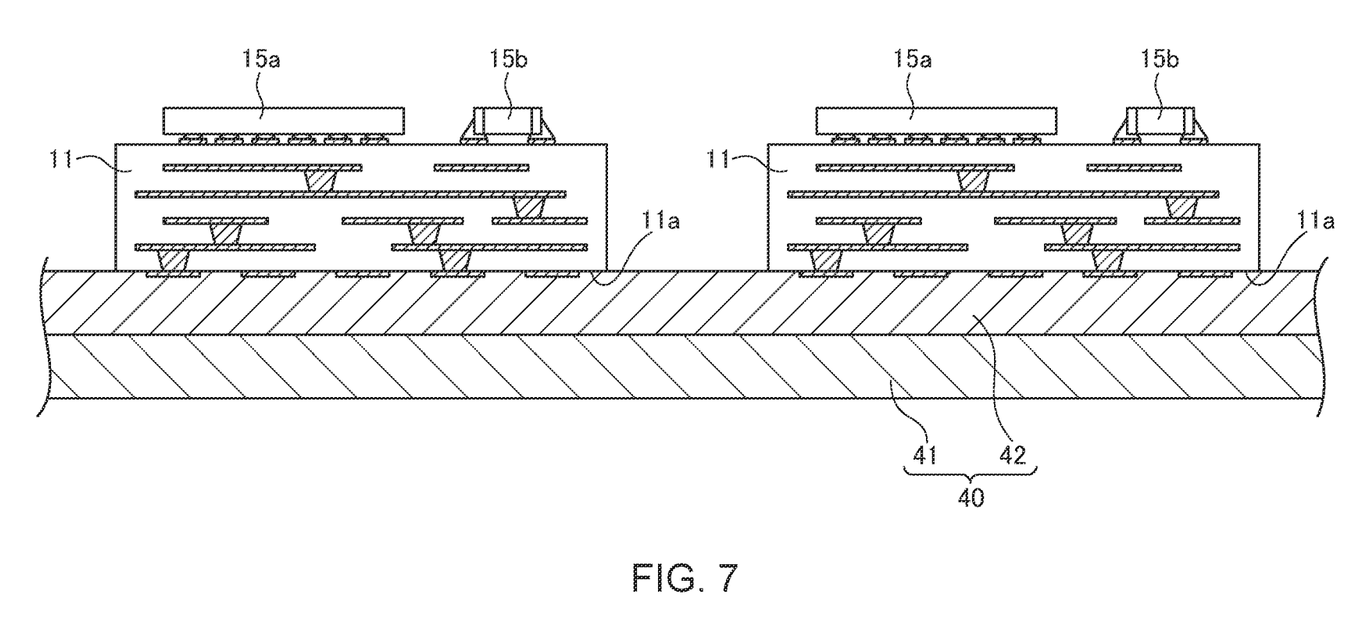
FIG. 7 to FIG. 12 are process views for explaining a manufacturing method of the electronic circuit module 10.

As illustrated in FIG. 7, a plurality of the circuit boards 11 each mounting the electronic components $15a$ and $15b$ are prepared and stuck, at their individual lower surfaces $11a$, to a support member 40. In the example of FIG. 7, the support member 40 is constituted of a heat-resistant plate material 41 and a heat-resistant double-sided tape 42, and the lower surface $11a$ of the circuit board 11 is stuck to the heat-resistant double-sided tape 42. The heat-resistant plate material 41 may be a core material having a thickness of about 0.3 mm. The heat-resistant double-sided tape 42 preferably has an adhesive strength of about 0.5 N/20 mm to about 5 N/20 mm and an adhesive thickness of 15 μm or more. An excessively low adhesive strength causes the circuit board 11 to be delaminated from the support member 40 at the time of formation of the mold member 16. An excessively high adhesive strength makes it difficult to achieve subsequent mechanical delaminating. An excessively small adhesive thickness causes the circuit board 11 to be delaminated from the support member 40.

Figure 8:
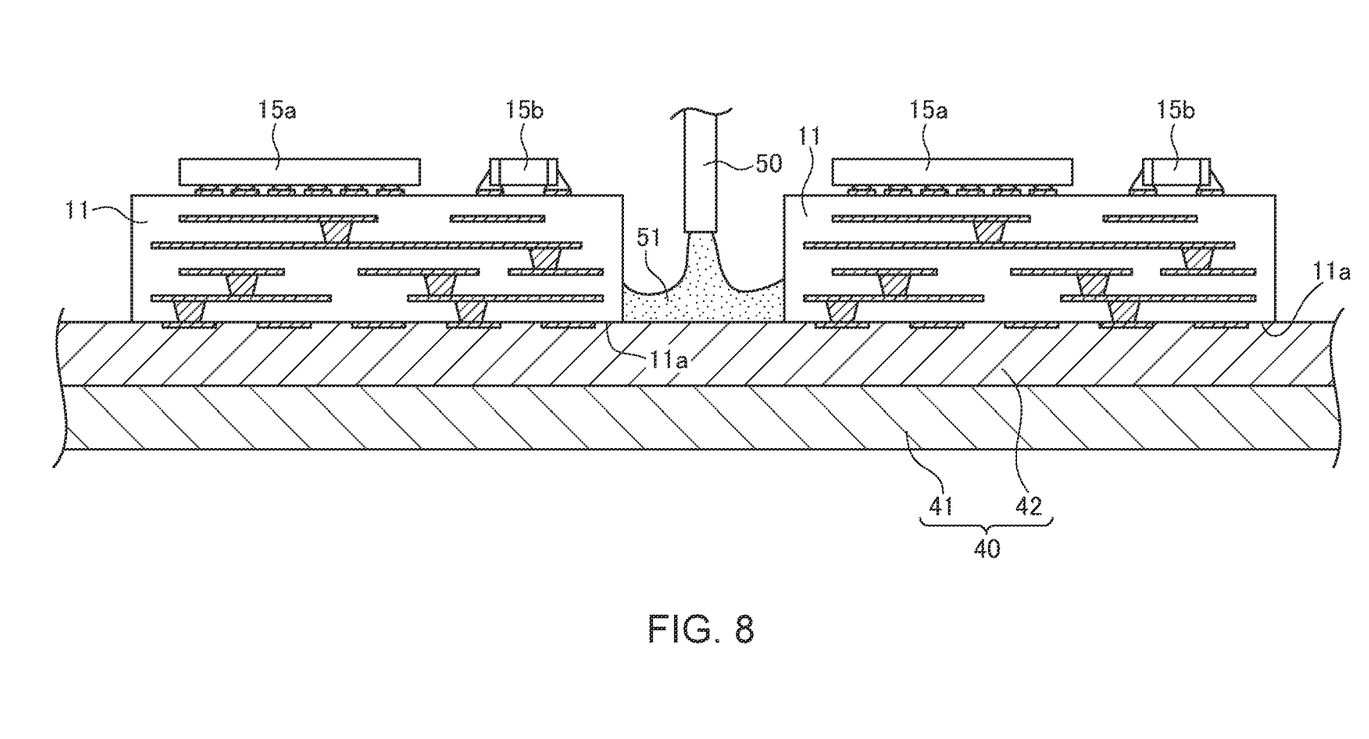
Figure 9:
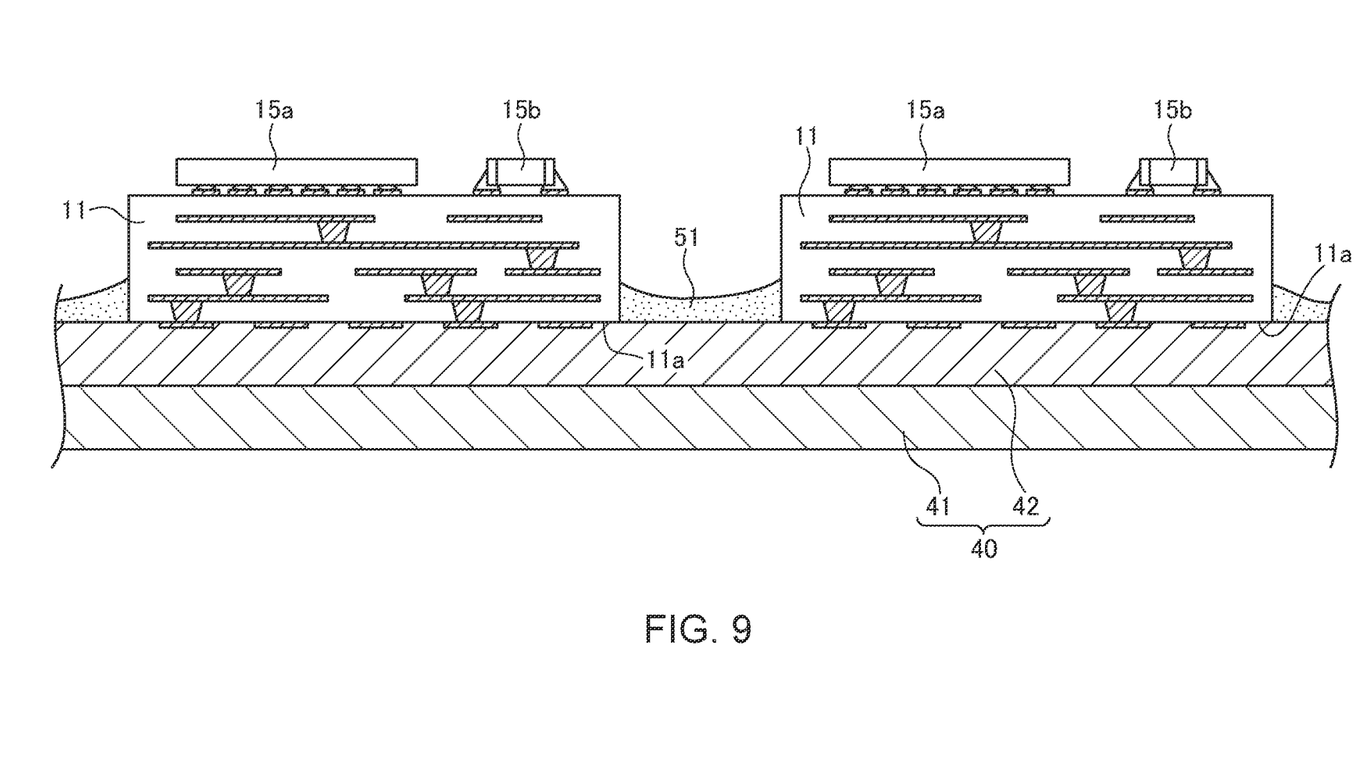

Then, as illustrated in FIG. 8, a space forming material 51 of a liquid type is supplied from a dispenser 50, and the surface of the support member 40 that is positioned between the adjacent circuit boards 11 is covered with the space forming material 51. The space forming material 51 is preferably a thermosetting resin mixture and, more preferably, a material of a liquid type that can be delivered by a dispenser and whose viscosity can be adjusted by heating. Further, in order to facilitate subsequent delaminating, a material having a linear expansion coefficient different significantly from that of the mold member 16 is preferably used. At this time, not the entire side surface $11c$ of the circuit board 11 is covered with the space forming material 51, but only the lower area $11c_1$ is selectively covered (that is, the upper area $11c_2$ is not covered with the space forming material 51). After that, as illustrated in FIG. 9, the space forming material 51 is dried and cured. The space forming material 51 before being cured is in a liquid state, so that the surface of the space forming material 51 is curved (concaved at the center) by the effect of surface tension.

Figure 10:
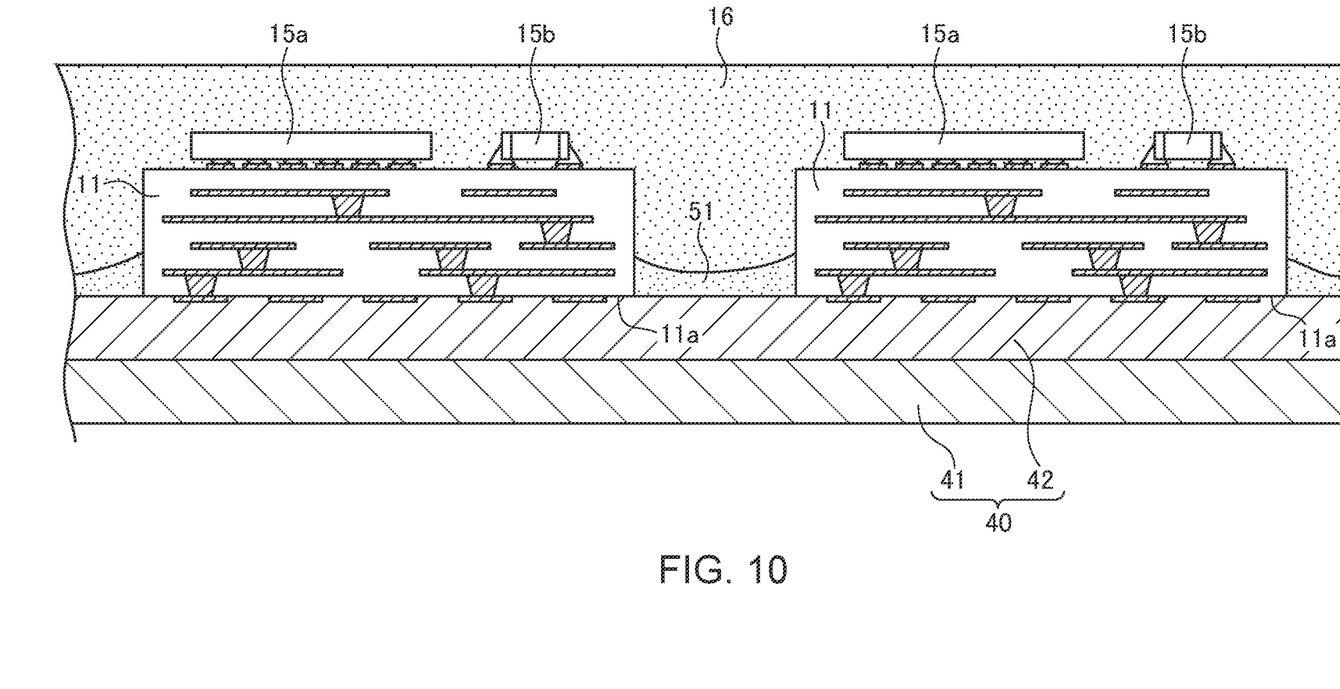
Figure 11:
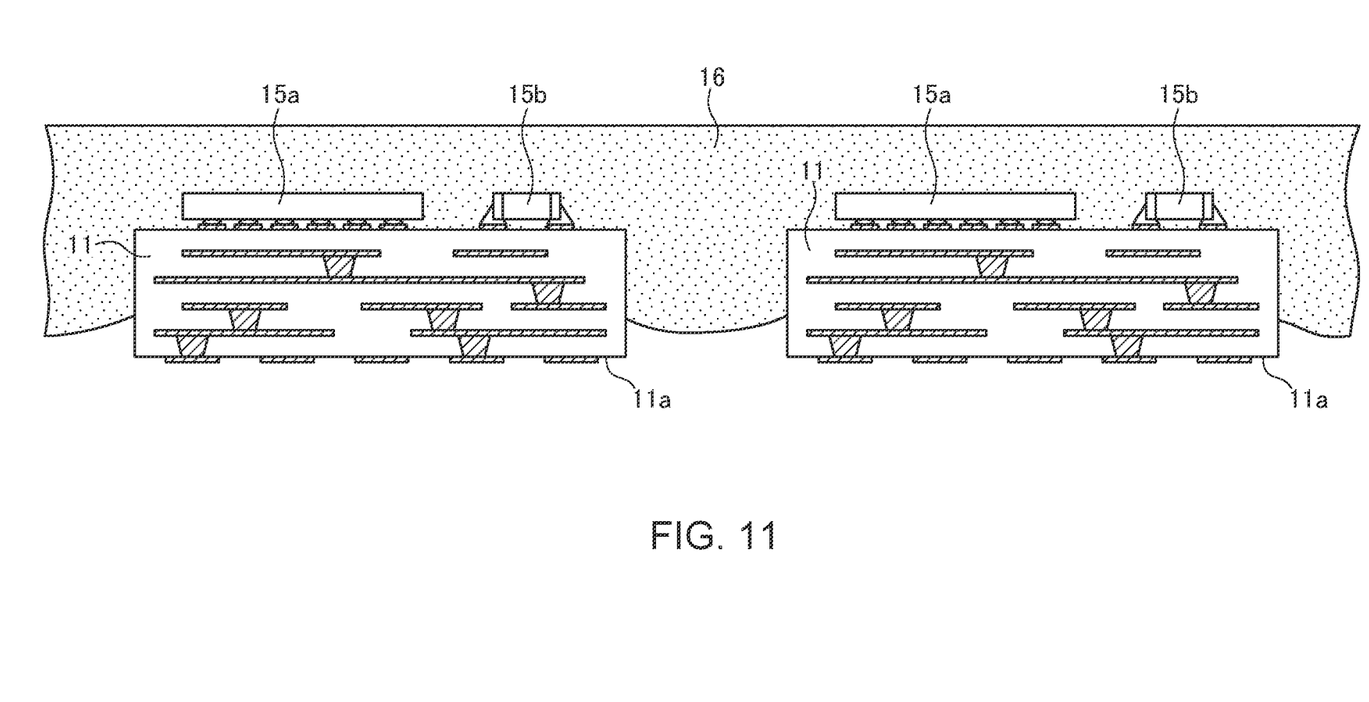

Then, as illustrated in FIG. 10, the mold member 16 is supplied so as to cover the plurality of circuit boards 11. The mold member 16 can be supplied by a dispenser method, a print method, a transfer mold method, a compression mold method, or the like. As a result, the electronic components $15a$ and $15b$ mounted on the upper surface $11b$ of the circuit board 11 are embedded in the mold member 16, and the mold member 16 is filled between the adjacent circuit boards 11. After that, as illustrated in FIG. 11, the support member 40 and space forming material 51 are removed, with the result that the upper area $11c_2$ of the side surface $11c$ of the circuit board 11 is covered with the mold member 16, while the lower area $11c_1$ is exposed.

Figure 12:
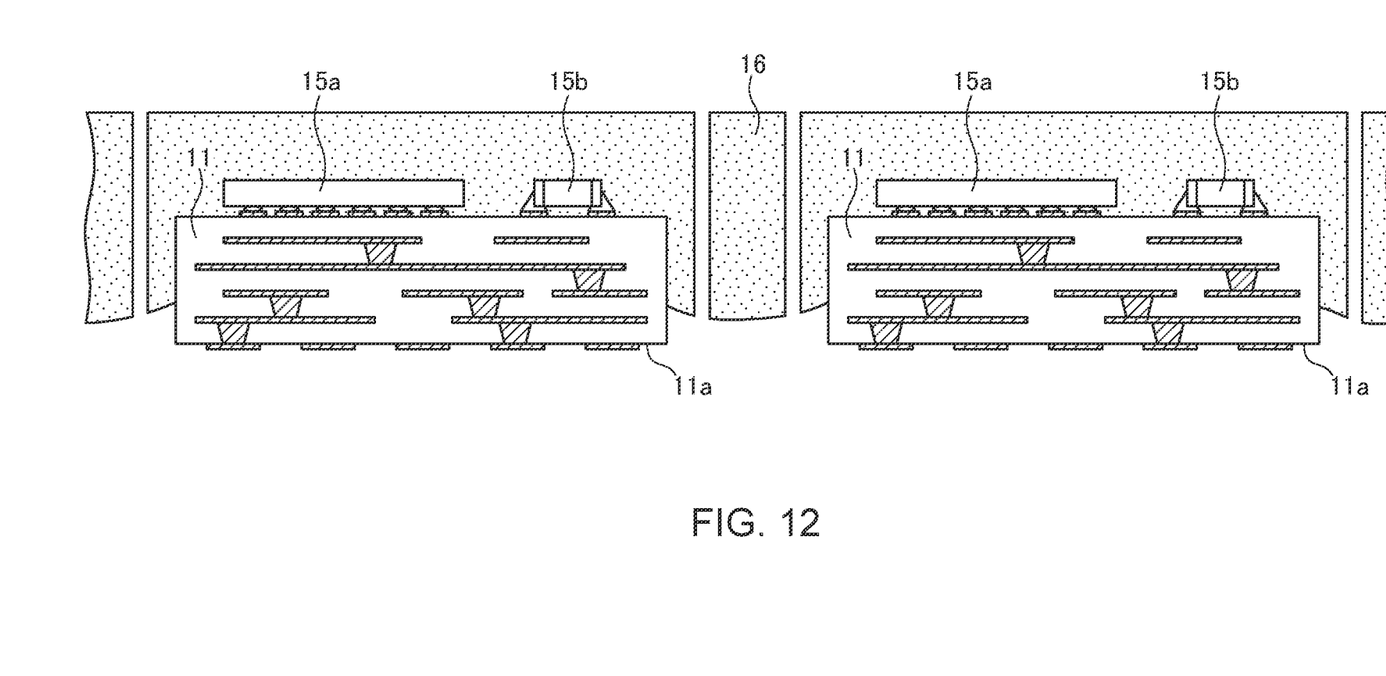

Then, as illustrated in FIG. 12, the mold member 16 is cut for individualization to obtain multiple electronic circuit modules each having the configuration illustrated in FIG. 1. According to the above manufacturing method, it is possible to adjust the area of the lower area $11c_1$ to be exposed from the mold member 16 depending on the supply amount of the space forming material 51. The end surface $16c$ of the mold member 16 can be formed into a tapered shape by surface tension of the space forming material 51, and the tapered angle can be adjusted by the viscosity, etc., of the space forming material 51.

The thus obtained electronic circuit module 10 can be mounted on another circuit board (e.g., the circuit board 21). After being mounted on the circuit board 21, the electronic circuit module 10 is supplied with the underfill material 28 and covered with the mold member 26, whereby the electronic circuit module 20 illustrated in FIG. 3 can be obtained. The thus obtained electronic circuit module 20 can be mounted on still another circuit board (e.g., the circuit board 31), whereby the electronic circuit module 30 illustrated in FIG. 6 can be obtained.

While the preferred embodiment of the present invention has been described, the present invention is not limited to the above embodiment, and various modifications may be made within the scope of the present invention, and all such modifications are included in the present invention.

What is claimed is:

1. An electronic circuit module comprising:
   a first circuit board having an upper surface, a lower surface opposite to the upper surface, and a side surface, the side surface including an upper area positioned on aside close to the upper surface and a lower area positioned on a side close to the lower surface;
   an electronic component mounted on the upper surface of the first circuit board; and
   a first mold member that covers the upper surface of the first circuit board and the upper area of the side surface of the first circuit board so as to embed therein the electronic component without covering the lower area of the side surface of the first Circuit board,
   wherein the first mold member has an inner surface contacting the upper area of the side surface of the first circuit board, an outer surface opposite to the inner surface, and an end surface connecting a lower end portion of the outer surface and a lower end portion of the inner surface,
   wherein the end surface of the first mold member has a concave curved shape such that a virtual straight line extends from the lower end portion of the outer surface to the lower end portion of the inner surface without passing through the mold member, and
   wherein the electronic circuit module further comprises:
   a second circuit board having an upper surface on which the first circuit board is mounted and a lower surface opposite to the upper surface; and
   a second mold member that covers the upper surface of the second circuit board so as to embed therein the first circuit board such that the first mold member is located between an upper surface of the electronic component and the second mold member.

2. The electronic circuit module as claimed in claim 1, wherein the end surface of the first mold member protrudes toward the lower surface of the first circuit board as the side surface of the circuit board is approached.

3. The electronic circuit module as claimed in claim 1, wherein the end surface of the first mold member has a shape that becomes more horizontal as it a distance from the side surface of the first circuit board increases.

4. The electronic circuit module as claimed in claim 1, wherein the first circuit board has a multilayer structure including more than two wiring layers.

5. The electronic circuit module as claimed in claim 1, wherein the upper area of the side surface of first circuit board and the lower area of the side surface of first circuit board are made of the same material.

6. The electronic circuit module as claimed in claim 1, wherein the side surface is substantially perpendicular to the upper and lower surfaces.

7. The electronic circuit module as claimed in claim 1, wherein a boundary between the end surface of the first mold member and the outer surface of the first mold member forms a sharp edge.

8. The electronic circuit module as claimed in claim 1, wherein a boundary between the end surface of the first mold member and the inner surface of the first mold member forms an acute angle.

9. The electronic circuit module as claimed in claim 1, wherein a boundary between the end surface of the first mold member and the outer surface of the first mold member forms an obtuse angle.

10. The electronic circuit module as claimed in claim 1, wherein an upper surface of the electronic component entirely contacts with the first mold member.

11. The electronic circuit module as claimed in claim 1, wherein the upper surface of the electronic component entirely covered with the first mold member so as not to contact with the second mold member.

12. The electronic circuit module as claimed in claim 1, further comprising an insulating member contacting with the lower area of the side surface of the first circuit board.

13. The electronic circuit module as claimed in claim 12, wherein a space between the lower surface of the first circuit board and the upper surface of the second circuit board is filled with the insulating member.

14. The electronic circuit module as claimed in claim 13, wherein the outer surface of the first mold member contacts with the insulating member.

15. The electronic circuit module as claimed in claim 14, further comprising another electronic component mounted on the upper surface of the second circuit board,
    wherein the another electronic component contacts with both the second mold member and the insulating member.

16. An electronic circuit module comprising:
    a first circuit board having an upper surface, a lower surface opposite to the upper surface, and a side surface, the side surface including an upper area positioned on a side close to the upper surface and a lower area positioned on a side close to the lower surface;
    an electronic component mounted on the upper surface of the first circuit board; and
    a first mold member that covers the upper surface of the first circuit board and the upper area of the side surface of the first circuit board so as to embed therein the electronic component without covering the lower area of the side surface of the first circuit board,
    wherein the first mold member has an inner surface contacting the upper area of the side surface of the first circuit board, an outer surface opposite to the inner surface, and an end surface connecting a lower end portion of the outer surface and a lower end portion of the inner surface,
    wherein the end surface of the first mold member has a curved shape,
    wherein the end surface of the first mold member has a first lower end portion terminating at the inner surface, a second lower end portion terminating at the outer surface, and a bottom portion located between the first lower end portion and the second lower end portion,
    wherein, in a first section between the first lower end portion and the bottom portion, the end surface of the first mold member has a shape that becomes more horizontal as a distance from the side surface of the first circuit board increases, and
    wherein, in a second section between the second lower end portion and the bottom portion, the end surface of the first mold member has a shape that becomes more horizontal as the distance from the side surface of the first circuit board decreases.

17. An electronic circuit module, comprising:
    a first circuit board having an upper surface, a lower surface opposite to the upper surface, and a side surface, the side surface including an upper area positioned on a side close to the upper surface and a lower area positioned on a side close to the lower surface;
    an electronic component mounted on the upper surface of the first circuit board; and a first mold member that covers the upper surface of the first circuit board and the upper area of the side surface of the first circuit board so as to embed therein the electronic component without covering the lower area of the side surface of the first circuit board, wherein the first mold member has an inner surface contacting the upper area of the side surface of the first circuit board, an outer surface opposite to the inner surface, and an end surface connecting a lower end portion of the outer surface and a lower end portion of the inner surface, wherein the end surface of the first mold member has a curved shape, wherein the end surface of the first mold member has a first lower end portion terminating at the inner surface, a second lower end portion terminating at the outer surface, and a bottom portion located between the first lower end portion and the second lower end portion, wherein, in a first section between the first lower end portion and the bottom portion, the end surface of the first molding member protrudes toward the lower surface of the first circuit board as a distance from the side surface of the first circuit board decreases, and wherein, in a second section between the second lower end portion and the bottom portion, the end surface of the first mold member protrudes toward the lower surface of the first circuit board as the distance from the side surface of the first circuit board increases.

\* \* \* \* \*